(12) United States Patent
Xiong

(10) Patent No.: US 10,374,061 B2
(45) Date of Patent: Aug. 6, 2019

(54) DISPLAY DEVICE

(71) Applicant: EverDisplay Optronics (Shanghai) Limited, Shanghai (CN)

(72) Inventor: Nana Xiong, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 15/628,759

(22) Filed: Jun. 21, 2017

(65) Prior Publication Data

US 2018/0026117 A1 Jan. 25, 2018

(30) Foreign Application Priority Data

Jul. 22, 2016 (CN) .......................... 2016 1 0584566

(51) Int. Cl.
*G09G 3/32* (2016.01)
*H01L 27/12* (2006.01)
(Continued)

(52) U.S. Cl.
CPC ......... *H01L 29/66742* (2013.01); *G09G 3/32* (2013.01); *H01L 27/1214* (2013.01); *H01L 27/3248* (2013.01); *H01L 29/78606* (2013.01); *G09G 2230/00* (2013.01); *G09G 2300/043* (2013.01); *G09G 2300/0408* (2013.01); *G09G 2310/0248* (2013.01); *G09G 2310/0256* (2013.01); *G09G 2330/023* (2013.01); *G09G 2330/12* (2013.01)

(58) Field of Classification Search
CPC ......... H01L 29/66742; H01L 29/78606; H01L 27/3248; H01L 27/1214; G09G 3/32; G09G 2300/0408; G09G 2300/043; G09G 2310/0248; G09G 2310/0256; G09G 2330/023; G09G 2330/12; G09G 2230/00
See application file for complete search history.

(56) References Cited

U.S. PATENT DOCUMENTS

| | | | | |
|---|---|---|---|---|
| 2011/0080173 A1* | 4/2011 | Kim | ....................... | G09G 3/006 324/403 |
| 2013/0335397 A1* | 12/2013 | Kim | ....................... | G09G 3/006 345/212 |
| 2014/0354285 A1* | 12/2014 | Kim | ..................... | G09G 3/3233 324/414 |

FOREIGN PATENT DOCUMENTS

| CN | 1949326 A | 4/2007 |
|---|---|---|
| CN | 101038714 A | 9/2007 |

(Continued)

OTHER PUBLICATIONS

The CN1OA dated Apr. 16, 2019 by the CNIPA.

*Primary Examiner* — Brent D Castiaux
(74) *Attorney, Agent, or Firm* — Yunling Ren

(57) ABSTRACT

The present disclosure provides a display device, including: a gate line and a data line; a pixel array; a gate driver, configured to provide a gate signal to the gate line; a test circuit, coupled to a first input line and a second input line respectively; and a data driver, including a first power line, a first transistor and a third input line, wherein the first power line is configured to supply an initial voltage to the pixel array, the first power line is coupled to the first input line via the first transistor, a gate of the first transistor is coupled to the third input line, the third input line is configured to transmit a pre-charge control signal, and the pixel array is configured to supply the initial voltage to each pixel in the pixel array based on the pre-charge control signal.

10 Claims, 7 Drawing Sheets

(51) Int. Cl.
*H01L 27/32* (2006.01)
*H01L 29/66* (2006.01)
*H01L 29/786* (2006.01)

(56) References Cited

FOREIGN PATENT DOCUMENTS

| | | |
|---|---|---|
| CN | 102005166 A | 4/2011 |
| CN | 103489394 A | 1/2014 |
| CN | 104956427 A | 9/2015 |
| CN | 106935200 A | 7/2017 |
| JP | 2004294752 A | 10/2004 |
| KR | 20050004936 A | 1/2005 |

* cited by examiner

DISPLAY DEVICE

TECHNICAL FIELD

The present disclosure relates to the field of display technologies, and in particular, to a display device which is pre-charged by using a conventional test circuit.

BACKGROUND

At present, in order to solve the problem that the integrated circuit of a small-sized display product has a high cost, generally a data line (IC data line) of the integrated circuit is employed to push a plurality of data lines (panel data lines) on a panel of the display product to thus drive the panel.

The specific layout manner is to mate one IC output fan-out line to N data lines on the panel by using N groups of switching TFTs (Thin Film Transistors), and thus to implement charging of N rows of data on the panel by controlling the time sequence. In practice, however, since the N groups of TFTs can only be turned on sequentially, the second to the $N^{th}$ turned-on TFTs may, due to data line parasitic capacitance and the like, charge incorrect data to the pixels within the duration when the first TFT is turned on, thereby affecting display of the screen. As such, the panel needs to be pre-charged, such that image display is normal. The layout for this generally is: N groups of TFTs are connected in series to the N data lines, and source voltages and drain voltages of these TFTs are respectively refresh voltages needed for the data lines and the pre-charge. Such layout consumes a large space, which is a great challenge for the display product having a small size. For implementing the pre-charge function of the panel, a traditional approach is to additionally configure a circuit for switching signals on the basis of the original circuit layout, but the additional circuit may occupy a very large space.

FIG. 1 is a schematic diagram illustrating circuit modules of a display device in the related art. FIG. 2 is a schematic diagram illustrating coupling of a data driver in the display device in the related art. As illustrated in FIG. 1 and FIG. 2, a conventional display device includes: a pixel array, a test circuit 2', a gate driver 3', a light-emitting control driver 4' and a data driver 5'. The pixel array is arranged at a crossed region of the gate line and the data line, and is arranged in a display region 1' of the display device. The gate driver 3' is configured to provide a gate signal to the gate line. The test circuit 2' is respectively coupled to a first input line 6' and a second input line 7' of the data driver 5'. The first input line 6' is configured to transmit a test signal, the second input line 7' is configured to transmit a test control signal, and the test circuit 2' is configured to provide the test signal to the data line based on the test control signal. A first power line 8' in the data driver 5' is configured to supply an initial voltage to the pixels. The light-emitting control driver 4' is arranged on the panel to face the gate driver 3', the pixel array is inserted between the light-emitting control driver 4' and the gate driver 3', and the light-emitting control driver 4' is configured to provide a light-emitting control signal to a light-emitting control line parallel to the gate line. The data driver 5' is arranged on the panel to face the test circuit 2', wherein the pixel array is inserted between the data driver 5' and the test circuit 2', and the data driver 5' is configured to provide a data signal to the data line in the panel.

Still referring to FIG. 2, six first input lines 6' (D1, D2, D3, D4, D5 and D6) of the data driver 5' are respectively coupled to the display region 1' via six second transistors 12', and gates of the second transistors 12' are respectively coupled to the corresponding second input lines 7'. The six second transistors 12' are configured to control enable time of the data lines of the test circuit, and are coupled to gates of respective TFT transistors.

FIG. 3 is a schematic diagram illustrating pre-charge time sequence coupling of the display device in the related art. As illustrated in FIG. 3, before scanning signals are enabled, all the six second transistors 12' need to be firstly enabled, and additionally the voltage of the data lines needs to be pulled to a minimum voltage. STV, CKV1 and CKV2 are input signals of the gate driver 3', and STE, CKE1 and CKE2 are input signals of the light-emitting control driver 4'. Signals SW1-SW6 are control signals of the six second transistors 12'. The time scale in FIG. 3 may be adjusted according to the resolution, and the voltage may also be adjusted. However, such integrated circuit has a complicated time sequence, which increases power consumption of the integrated circuit.

In view of the above, the present inventor aims to provide a display device that may be pre-charged by using a conventional test circuit.

SUMMARY

In view of the defects in the related art, the present invention intends to provide a display device, to overcome the difficulty in the related art, such that pre-charge may be implemented by using the conventional test circuit.

According to an aspect of the present invention, a display device is provided, including:
  a display region;
  a gate line and a data line, wherein the gate line and the data line are crosswise arranged;
  a pixel array, arranged at a crossed region of the gate line and the data line and arranged in the display region;
  a gate driver, configured to provide a gate signal to the gate line;
  a test circuit, coupled to a first input line and a second input line respectively, wherein the first input line is configured to transmit a test signal, the second input line is configured to transmit a test control signal, and the test circuit is configured to provide the test signal to the data line based on the test control signal; and
  a data driver, including a first power line, a first transistor and a third input line, wherein the first power line is configured to supply an initial voltage to the pixel array, the first power line is coupled to the first input line via the first transistor, a gate of the first transistor is coupled to the third input line, the third input line is configured to transmit a pre-charge control signal, and the pixel array is configured to supply the initial voltage to each pixel in the pixel array based on the pre-charge control signal.

In an example, the data driver further includes a second transistor, the first input line is coupled to the pixel array via the second transistor, and a gate of the second transistor is coupled to the corresponding second input line.

In an example, the second transistor is arranged between the first transistor and the display region.

In an example, the display device further includes a light-emitting control driver, which is configured to provide a light-emitting control signal to a light-emitting control line parallel to the gate line.

In an example, the gate driver and the light-emitting control driver are respectively arranged on two dissimilar sides of the pixel array.

In an example, the data driver and the test circuit are respectively arranged on two dissimilar sides of the pixel array, and the data driver is configured to provide a data signal to the data line.

In an example, the first input line is arranged outside the display region.

In an example, the second input line is arranged outside the display region.

In an example, the first input line is more proximal to the pixel array than the second input line.

In an example, the first power line is coupled to a side of the pixel array.

In view of the above, the display device according to the present invention may be pre-charged by using the conventional test circuit, the time sequence of the integrated circuit is simple, and the data voltage output by the integrated circuit does not need to be frequently adjusted to a minimum voltage, thereby reducing power consumption of the integrated circuit.

BRIEF DESCRIPTION OF THE DRAWINGS

By reading the detail description of the non-limitative embodiments with reference to the accompanying drawings, other features, objectives and advantages of the present invention will become more apparent.

REFERENCE NUMERALS AND DENOTATIONS THEREOF

Figure 1:
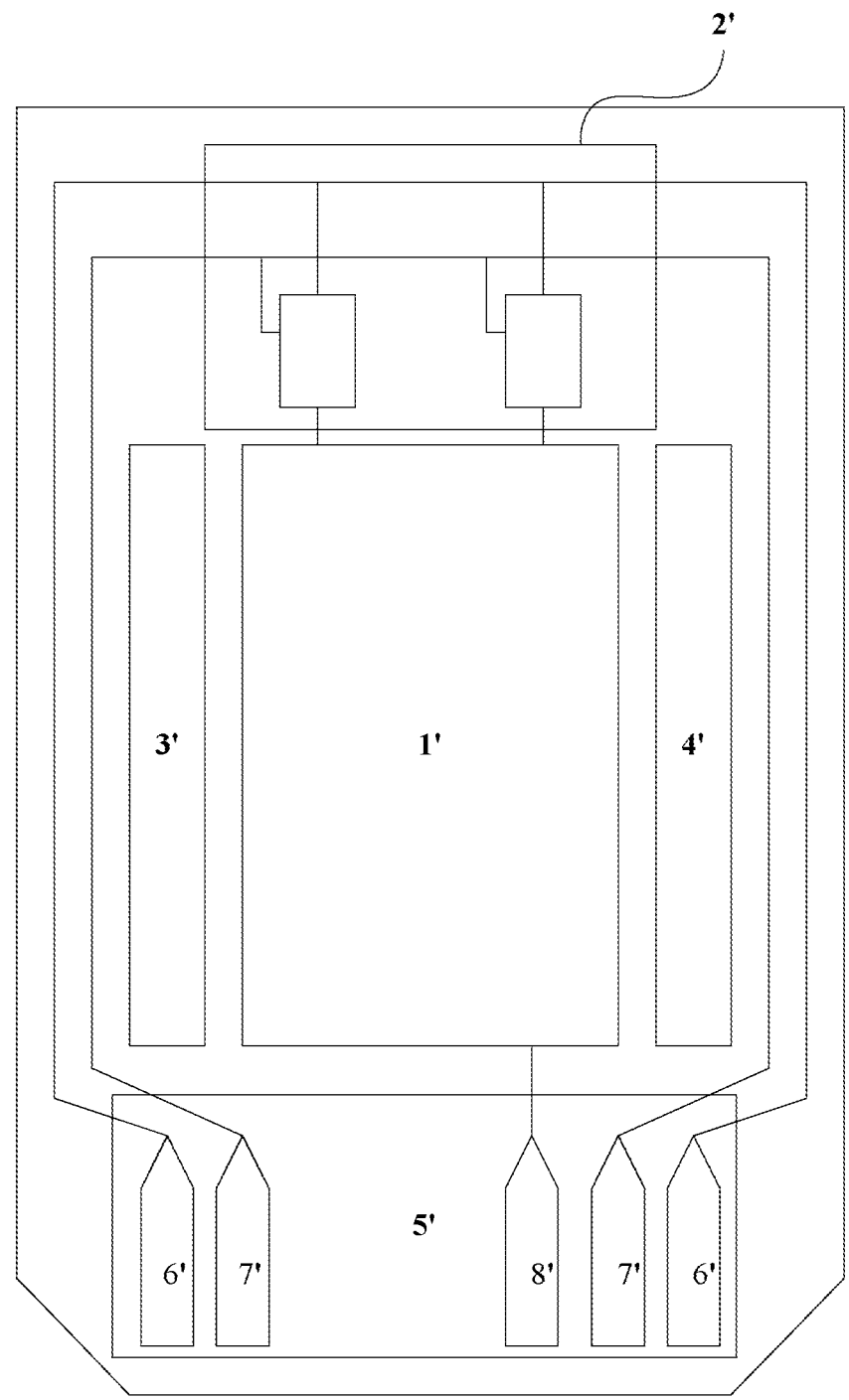
FIG. 1 is a schematic diagram illustrating circuit modules of a display device in the related art.
Figure 2:
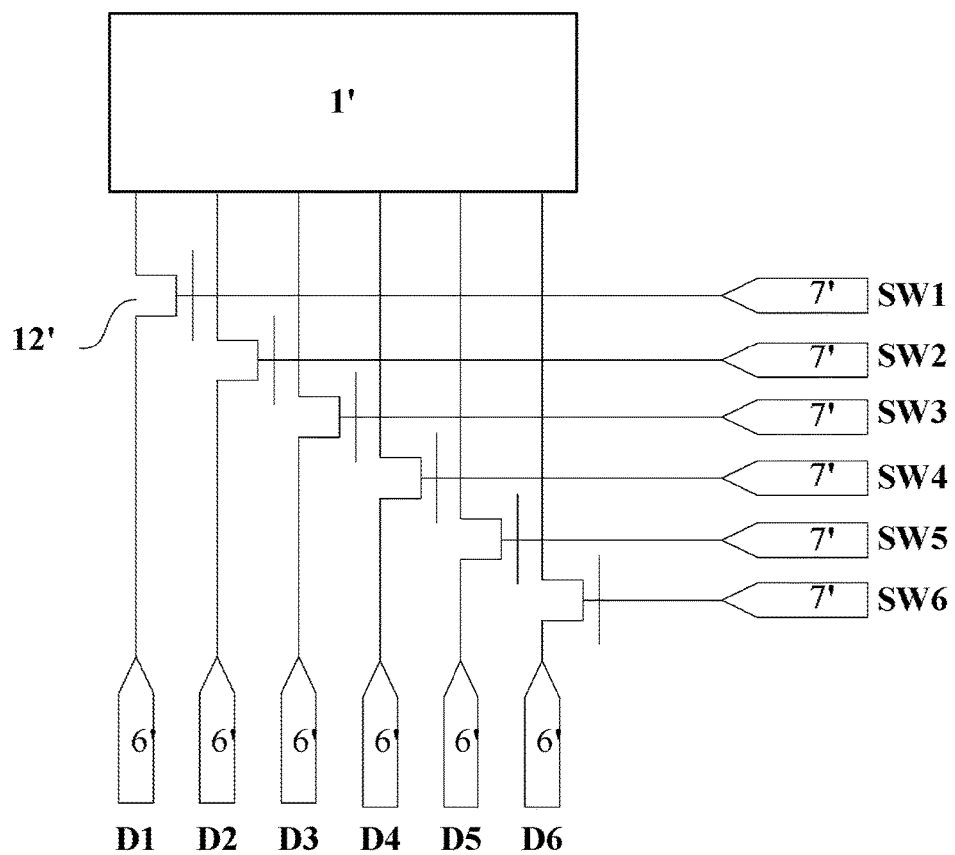
FIG. 2 is a schematic diagram illustrating coupling of a data driver in the display device in the related art.
Figure 3:
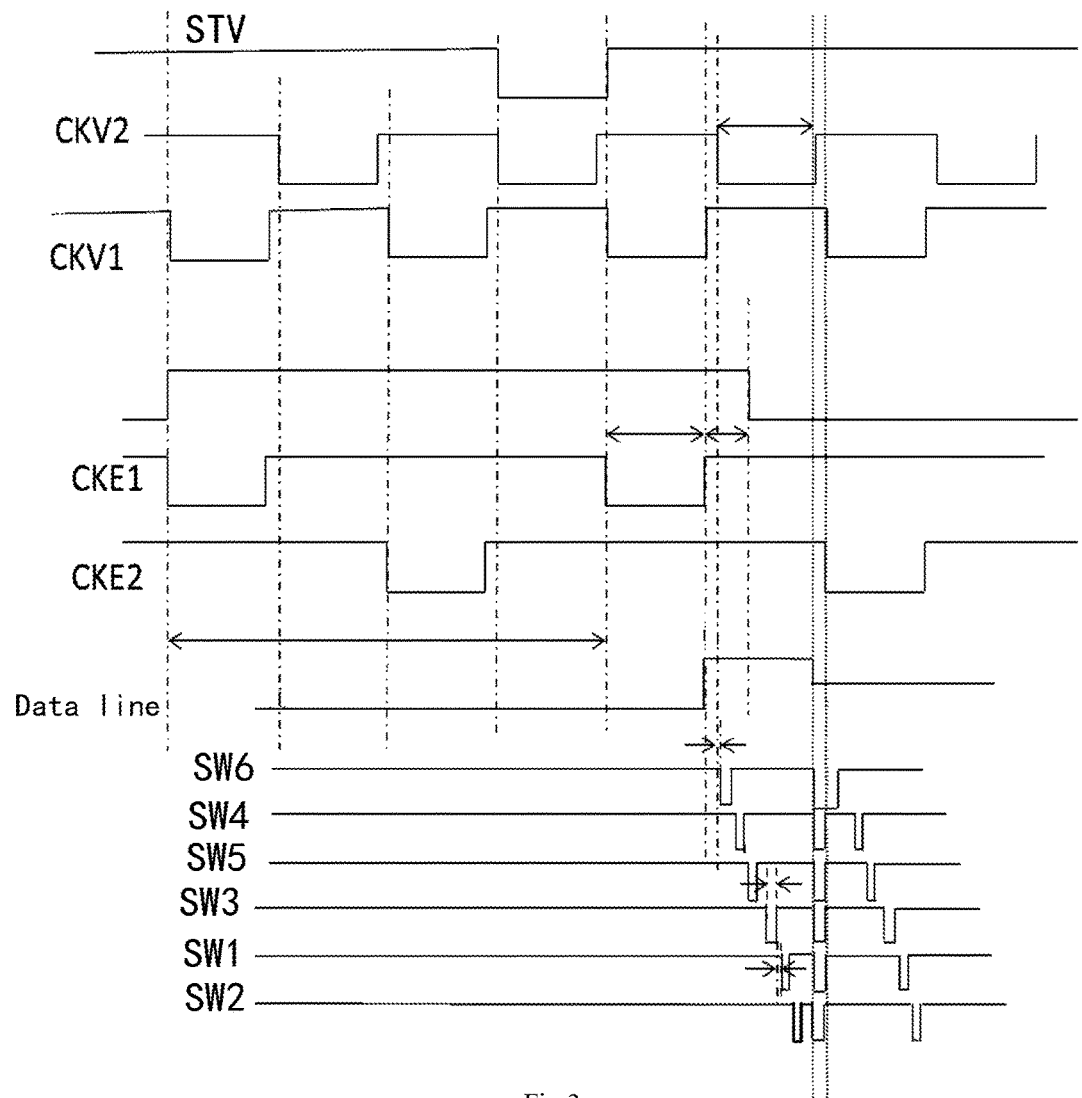
FIG. 3 is a schematic diagram illustrating pre-charge time sequence coupling of the display device in the related art.

1' display region
2' test circuit
3' gate driver
4' light-emitting control driver
5' data driver
6' first input line
7' second input line
8' first power line
12' second transistor
1 display region
2 test circuit
3 gate driver
4 light-emitting control driver
5 data driver
6 first input line
7 second input line
8 first power line
9 third input line
11 first transistor
12 second transistor

DETAILED DESCRIPTION

Exemplary embodiments of the present invention are hereinafter described in detail with reference to accompany drawings. However, the exemplary embodiments may be implemented in a plurality of manners, and shall not be construed as being limited to the embodiments described hereinafter. On the contrary, such exemplary embodiments more thoroughly and completely illustrate the present invention, and fully convey the concepts of the exemplary embodiments to persons skilled in the art. In the drawings, like reference numerals denote like or similar structures or elements, repetitive descriptions thereof are thus omitted.

In addition, the described characteristics, structures, or features may be incorporated in one or more embodiments in any suitable manner. In the description hereinafter, more details are provided such that sufficient understanding of the embodiments of the present invention may be achieved. However, a person skilled in the art should note that, technical solutions of the present invention may also be practiced without one or more of the specific details, or by adopting other methods, elements, materials and the like. Under some circumstances, commonly known structures, materials or operations are not illustrated or described in detail to avoid various aspects of the present invention from becoming ambiguous.

Figure 4:
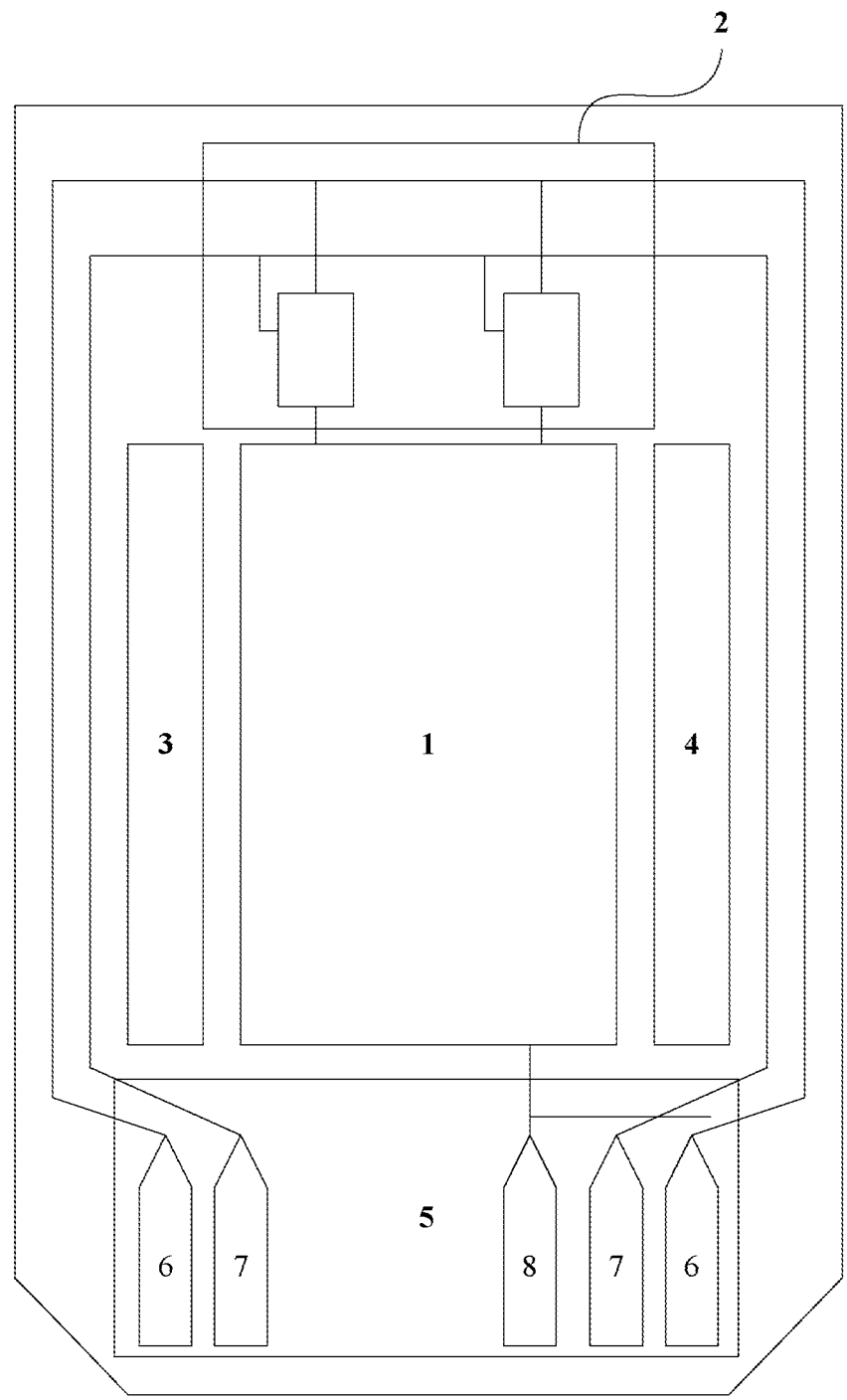
FIG. 4 is a schematic diagram illustrating circuit modules before welding of a display device according to the present invention.
Figure 5:
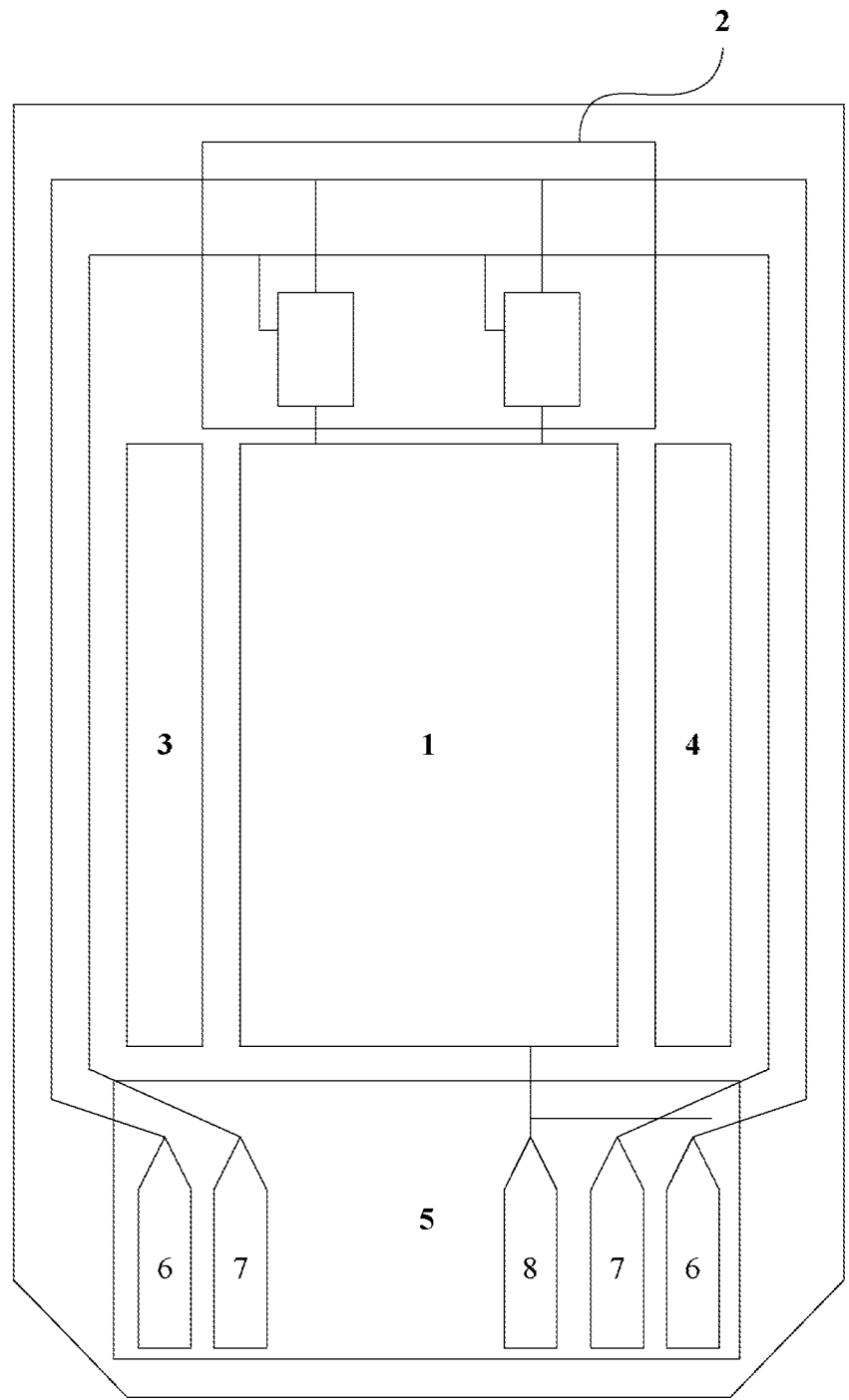
FIG. 5 is a schematic diagram illustrating circuit modules after welding of the display device according to the present invention.
Figure 6:
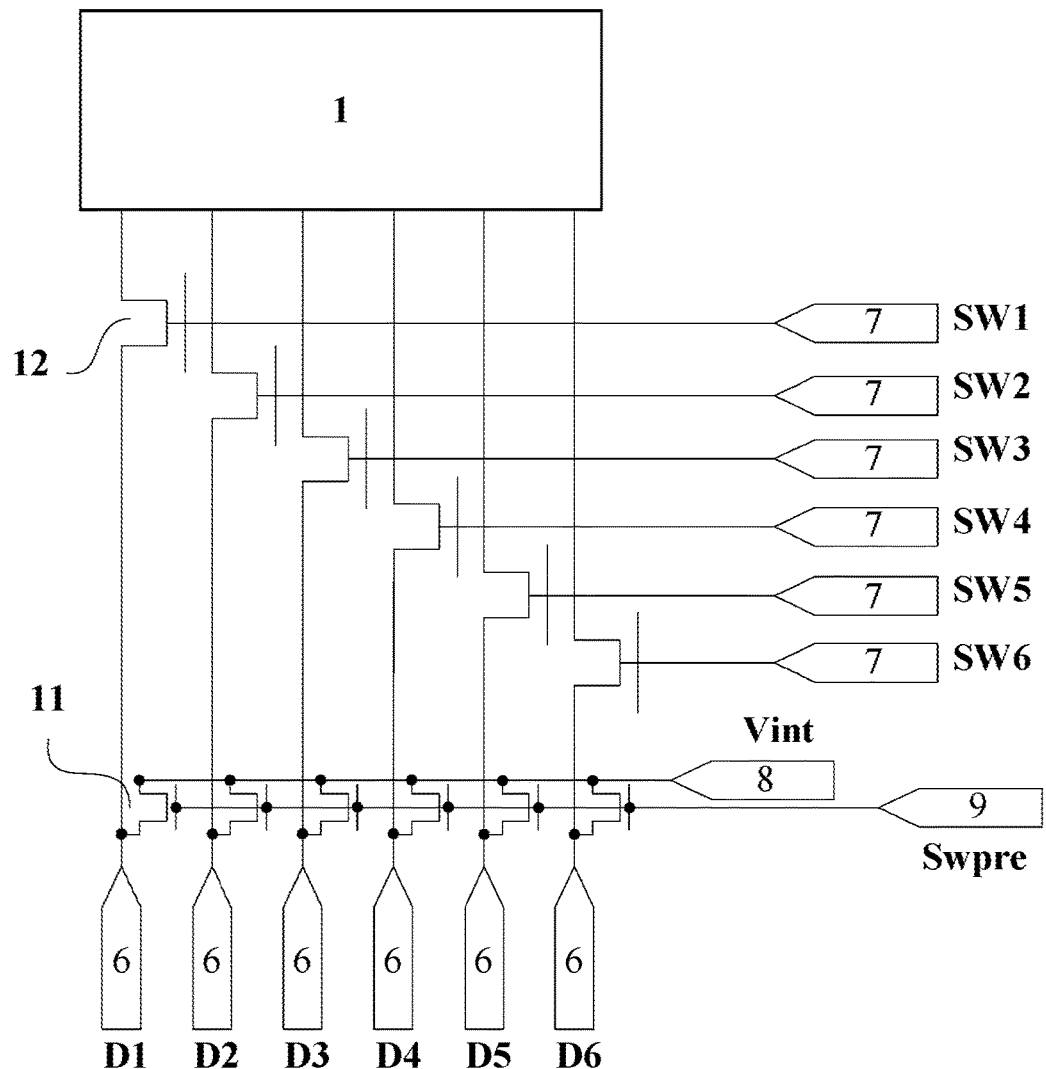
FIG. 6 is a schematic diagram illustrating coupling of a data driver in the display device according to the present invention.

FIG. 4 is a schematic diagram illustrating circuit modules before welding of a display device according to the present invention. FIG. 5 is a schematic diagram illustrating circuit modules after welding of the display device according to the present invention. FIG. 6 is a schematic diagram illustrating coupling of a data driver in the display device according to the present invention. As illustrated in FIG. 4 to FIG. 6, a first embodiment of the present invention provides a display device, including: a pixel array, a test circuit 2, a gate driver 3, a light-emitting control driver 4 and a data driver 5. The pixel array is arranged at a crossed region of the gate line and the data line and is arranged in a display region 1 of the display device. The gate driver 3 is configured to provide a gate signal to the gate line. The test circuit 2 is respectively coupled to a first input line 6 and a second input line 7, wherein the first input line 6 is configured to transmit test signals, the second input line 7 is configured to transmit test control signals, and the test circuit 2 is configured to provide the test signals (signals D1, D2, D3, D4, D5, and D6) to the data line based on the test control signals (signals SW1-SW6). The data driver 5 includes a first power line 8 (signal Vint), a first transistor 11, a second transistor 12 and a third input line 9 (signal Swpre). The first power line 8 is configured to supply an initial voltage to the pixel array, the first power line 8 is coupled to the first input line 6 via the first transistor 11, gates of the first transistors 11 are respectively coupled to the third input line 9, the third input line 9 is configured to transmit a pre-charge control signal, and the pixel array is configured to supply the initial voltage to each pixel in the pixel array based on the pre-charge control signal. The first input line 6 is coupled to the pixel array via the second transistor 12, and gates of the second transistors 12 are respectively coupled to the corresponding second input line 7. The second transistor 12 is arranged between the first transistor 11 and the display region 1.

According to the present invention, the light-emitting control driver 4 and the gate driver 3 are respectively arranged on two dissimilar sides of the pixel array, and the light-emitting control driver 4 is configured to provide a light-emitting control signal to a light-emitting control line parallel to the gate line. In an example solution, the gate driver 3 and the light-emitting control driver 4 are respectively arranged on two dissimilar sides of the pixel array, for example, a left side or a right side.

According to the present invention, the data driver 5 and the test circuit 2 are respectively arranged on two sides of the pixel array, and the data driver 5 is configured to provide a data signal to the data line. In an example solution, the test circuit 2 and the data driver 5 are respectively arranged on two dissimilar sides of the pixel array, for example, an upper side or a lower side.

In this embodiment, the first input lines 6 are arranged outside the display region, for example, arranged along a periphery of the pixel array, which is, however, not limited to such arrangement. The second input lines 7 are arranged outside the display region, for example, arranged along a periphery of the pixel array, which is, however, not limited to such arrangement. The first input lines 6 are more proximal to the pixel array than the second input lines 7, which is, however, not limited to such arrangement. The first power line 8 is coupled to a lower side of the pixel array.

The display device according to the present invention may be a display panel, or may be used in a mobile phone, a notebook computer or the like, which is not limited herein.

Hereinafter, still referring to FIG. 4, FIG. 5, FIG. 6 and FIG. 7, the difference between the circuits before and after welding of the display device, and the technical effects that may be achieved by the present invention are described.

Still referring to FIG. 4, in the display device before laser welding, the first power line 8 (signal line Vint) is not short-circuited to the data line 6 of the test circuit, and the panel may be normally subjected to a corresponding test.

Still referring to FIG. 5, via laser welding, the first power line 8 (signal line Vint) is short-circuited to the data line 6 of the test circuit. As such, the Vint signal may be written into the pixel region at a time point when pre-charge is needed, thereby implementing pre-charge.

As illustrated in FIG. 6, the first power line 8 (signal line Vint) is configured to supply an initial voltage to the pixels, six first input lines 6 (D1, D2, D3, D4, D5 and D6) are coupled to the first power line 8 (signal line Vint) and the display region 1 via the first transistors 11, gates of the first transistors 11 are all coupled to a third input line 9, the third input line 9 is configured to transmit a pre-charge control signal, and the display region 1 is configured to supply the initial voltage to each pixel in the pixel array based on the pre-charge control signal. In addition, the six first input lines 6 (D1, D2, D3, D4, D5 and D6) are respectively coupled to the display region 1 via six second transistors 12, gates of the second transistors 12 are respectively coupled to the corresponding second input lines 7, and the second input lines 7 respectively control turn on/turn off states of the six second transistors 12. The third input line 9 uniformly manages turn on/turn off states of the six first transistors 11. In this way, the input voltage Vint of the first power line 8 is written into (pixels in) the display region 1 by simple circuit coupling, which is creative, with no need to use the complicated logic circuit that is necessarily required in the related art. In an example, the second transistor 12 is arranged between the first transistor 11 and the display region 1.

In this embodiment, by adding six TFT transistor switch elements, the Swpre signal of the third input line 9 is used to control pre-charge; the input voltage Vint of the first power line 8 is an initial voltage that is needed by the pixels of an AMOLED. This initial voltage is even lower than the minimum data voltage. Therefore, the pre-charge function may be implemented, and the problem of display abnormality may be prevented. Considering the characteristic of the AMOLED that when a high voltage is input to the pixels, a low voltage may not be input any longer, the pre-charge is to ensure that the data signal of the panel is at a low voltage before correct voltages are input to the pixels.

Figure 7:
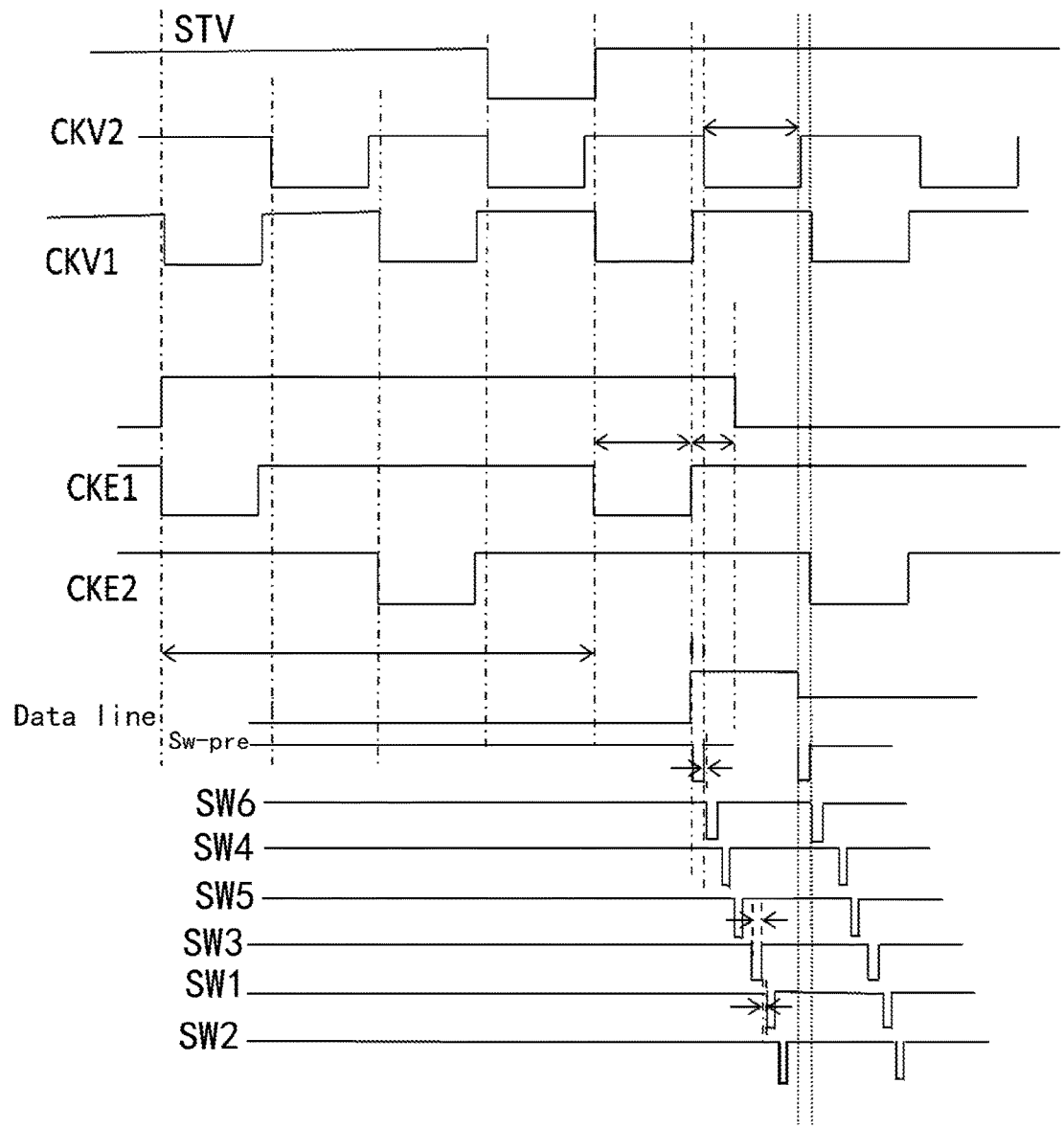
FIG. 7 is a schematic diagram illustrating pre-charge time sequence coupling of the display device according to the present invention.

FIG. 7 illustrates a time sequence of the control, wherein STV, CKV1 and CKV2 are input signals of the gate driver 3, and STE, CKE1 and CKE2 are input signals of the light-emitting control driver 4. Signals SW1-SW6 of the second input lines 7 are control signals of the six second transistors 12. The time scale in FIG. 7 may be adjusted according to the resolution, and the voltage may also be adjusted. As illustrated in FIG. 7, the time sequence of the Swpre signal of the third input line 9 is adjusted to become a low level before each scanning line, that is, the Swpre signal of the third input line 9 is firstly input with a low-level signal, the six first transistors 11 are turned on, and then the signals SW1-SW6 of the six second input lines 7 are sequentially input with low-level signals. The six second transistors 12 are sequentially turned on, such that the input voltage Vint of the first power line 8 is sequentially written into the pixels corresponding to the six first input lines 6 (D1, D2, D3, D4, D5 and D6) through the first transistors 11 and the second transistors 12, thereby implementing the function of pre-charging the pixels. In this way, the integrated circuit has a simple time sequence, and the data voltage output by the integrated circuit does not need to be frequently adjusted to a minimum voltage, thereby greatly reducing power consumption of the integrated circuit.

In conclusion, the display device according to the present invention may be pre-charged by using the conventional test circuit, the time sequence of the integrated circuit is simple, and the data voltage output by the integrated circuit does not need to be frequently adjusted to a minimum voltage, thereby reducing power consumption of the integrated circuit.

Specific embodiments of the present disclosure have been described above. It should be noted that the present invention is not limited to the above specific embodiments, and a person skilled in the art may make various variations or modifications within the scope defined by the claims, which do not affect the essential contents of the present invention.

The invention claimed is:

1. A display device, comprising:
   a display region;
   a gate line and a data line which are crosswise arranged;
   a pixel array, arranged at a crossed region of the gate line and the data line and arranged in the display region;
   a gate driver, configured to provide a gate signal to the gate line;
   a test circuit, coupled to a first input line and a second input line respectively, wherein the first input line is configured to transmit a test signal, the second input line is configured to transmit a test control signal, and the test circuit is configured to provide the test signal to the data line based on the test control signal; and
   a data driver, comprising a first power line, a first transistor and a third input line, wherein the first power line is configured to supply an initial voltage to the pixel array, the first power line is coupled to the first input line via the first transistor, a gate of the first transistor is coupled to the third input line, the third input line is configured to transmit a pre-charge control signal, and the pixel array is configured to supply the initial voltage to each pixel in the pixel array based on the pre-charge control signal.

2. The display device according to claim 1, wherein the data driver further comprises a second transistor, the first input line is coupled to the pixel array via the second transistor, and a gate of the second transistor is coupled to the corresponding second input line.

3. The display device according to claim 2, wherein the second transistor is arranged between the first transistor and the display region.

4. The display device according to claim 3, further comprising a light-emitting control driver configured to provide a light-emitting control signal to a light-emitting control line parallel to the gate line.

5. The display device according to claim 4, wherein the gate driver and the light-emitting control driver are respectively arranged on two dissimilar sides of the pixel array.

6. The display device according to claim 1, wherein the data driver and the test circuit are respectively arranged on two dissimilar sides of the pixel array, and the data driver is configured to provide a data signal to the data line.

7. The display device according to claim 1, wherein the first input line is arranged outside the display region.

8. The display device according to claim 7, wherein the second input line is arranged outside the display region.

9. The display device according to claim 8, wherein the first input line is more proximal to the pixel array than the second input line.

10. The display device according to claim 1, wherein the first power line is coupled to a side of the pixel array.

\* \* \* \* \*